United States Patent [19]
Nagai et al.

[11] Patent Number: 5,105,084
[45] Date of Patent: Apr. 14, 1992

[54] PYROELECTRIC INFRARED SENSOR WITH DIFFERENT SIZED EFFECTIVE LIGHT RECEIVING ELECTRODE AREAS AND A METHOD OF MANUFACTURING A DUAL PYROELECTRIC ELEMENT USED THEREIN

[75] Inventors: Aisaku Nagai; Tetuaki Kon, both of Iwaki, Japan

[73] Assignee: Kureha Kagaku Kogyo Kabushiki Kaisha, Tokyo, Japan

[21] Appl. No.: 581,255

[22] Filed: Sep. 11, 1990

Related U.S. Application Data

[63] Continuation of Ser. No. 333,931, Apr. 6, 1989, abandoned.

[30] Foreign Application Priority Data

Apr. 13, 1988 [JP] Japan ................. 63-49680[U]

[51] Int. Cl.⁵ ........................................ H01L 31/0224
[52] U.S. Cl. ................................................. 250/338.3
[58] Field of Search ................................. 250/338.3

[56] References Cited

U.S. PATENT DOCUMENTS 3,839,640 10/1974 Rossin .................................. 250/353
4,800,278 1/1989 Taniguti et al. ................... 250/338.1
4,803,360 2/1989 Ball et al. ....................... 250/338.1 X

FOREIGN PATENT DOCUMENTS 0131996 1/1985 European Pat. Off. .
58-32337 8/1983 Japan .
61-175583 8/1986 Japan .

Primary Examiner—Constantine Hannaher
Attorney, Agent, or Firm—Armstrong, Nikaido, Marmelstein, Kubovcik & Murray

[57] ABSTRACT

A pyroelectric infrared sensor includes a package having a light-receiving window, and at least two dual pyroelectric elements arranged in the package, each of the dual pyroelectric elements having first and second unit pyroelectric elements, the first and second unit pyroelectric elements being connected in series or parallel with each other so as to have opposite polarities, wherein the first and second light-receiving electrodes and the first and second back electrodes are formed such that an effective light-receiving electrode area of the first unit pyroelectric element opposing a central portion of the light-receiving window is smaller than an effective light-receiving electrode area of the second unit pyroelectric element opposing a peripheral portion of the light-receiving window. A difference between secondary infrared rays incident on the first and second unit pyroelectric elements which is caused by a difference between angles of visibility of these elements with respect to the light-receiving window can be compensated. This invention also relates to a method of manufacturing the dual pyroelectric element.

11 Claims, 3 Drawing Sheets

PYROELECTRIC INFRARED SENSOR WITH DIFFERENT SIZED EFFECTIVE LIGHT RECEIVING ELECTRODE AREAS AND A METHOD OF MANUFACTURING A DUAL PYROELECTRIC ELEMENT USED THEREIN

This is a continuation of application Ser. No. 333,931, filed Apr. 6, 1989, now abandoned.

BACKGROUND OF THE INVENTION

1. Field of the Invention

The present invention relates to a pyroelectric infrared sensor comprising a package having a light-receiving window, and at least two dual pyroelectric elements arranged in opposite to the light-receiving window and arranged in the package such that first and second unit pyroelectric elements constituting each dual pyroelectric element are connected in parallel or series with each other so as to have opposite polarities. The present invention also relates to a method of manufacturing the dual pyroelectric element.

2. Description of the Prior Art

High reliability is required for intrusion detection pyroelectric infrared sensors used for security and automatic doors. Various extensive studies and developments have been made to satisfy the above requirement. U.S. Pat. No. 3,839,640 discloses a pyroelectric infrared sensor wherein a pair of unit pyroelectric elements are connected in parallel or series with each other so as to have opposite polarities, thereby constituting a dual pyroelectric element and improving defects of generating detection errors caused by changes in room temperature and incidence of disturbing external light.

In a pyroelectric infrared sensor using one dual pyroelectric element, detection error tends to occur in response to a strong electromagnetic wave used in a personal radio transmitter/receiver. In order to eliminate such an error, a pyroelectric infrared sensor having a multiple pyroelectric element consisting of a plurality of dual pyroelectric elements encapsulated in a common package has been developed. When this multiple pyroelectric element is used, a detection error is determined when the plurality of dual pyroelectric elements are simultaneously operated.

However, it is found that the pyroelectric infrared sensor using the multiple pyroelectric element described above has an unexpected defect of degradation in electrical characteristics against disturbing external light as compared with a pyroelectric infrared sensor using one dual pyroelectric element.

DETAILED DESCRIPTION OF THE PREFERRED EMBODIMENTS

Figure 1:
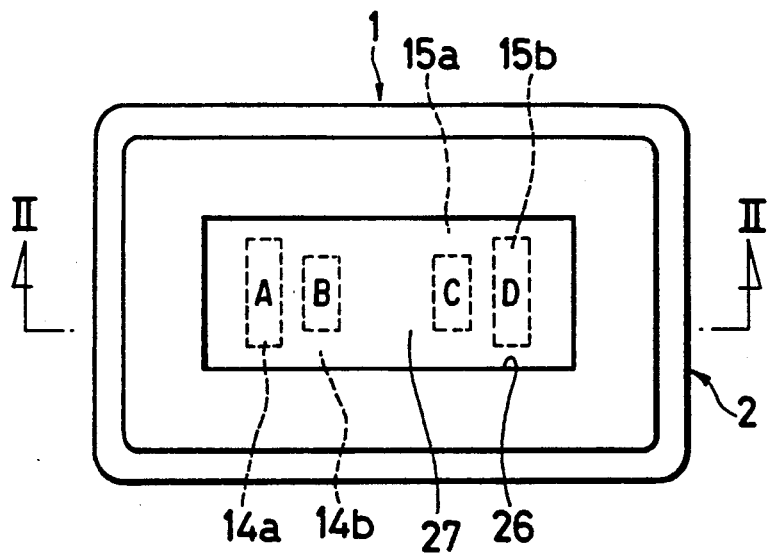
FIG. 1 is a plan view of a pyroelectric infrared sensor according to an embodiment of the present invention.
Figure 2:
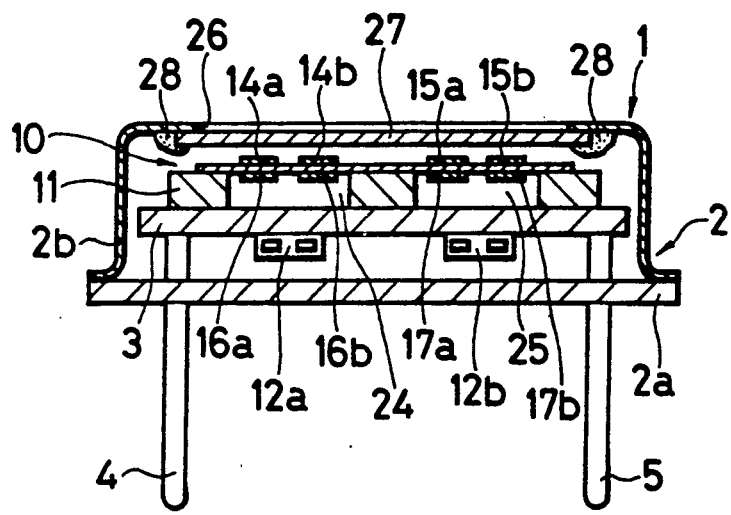
FIG. 2 is a sectional view showing the sensor of FIG. 1 along the line II —II thereof.
Figure 3:
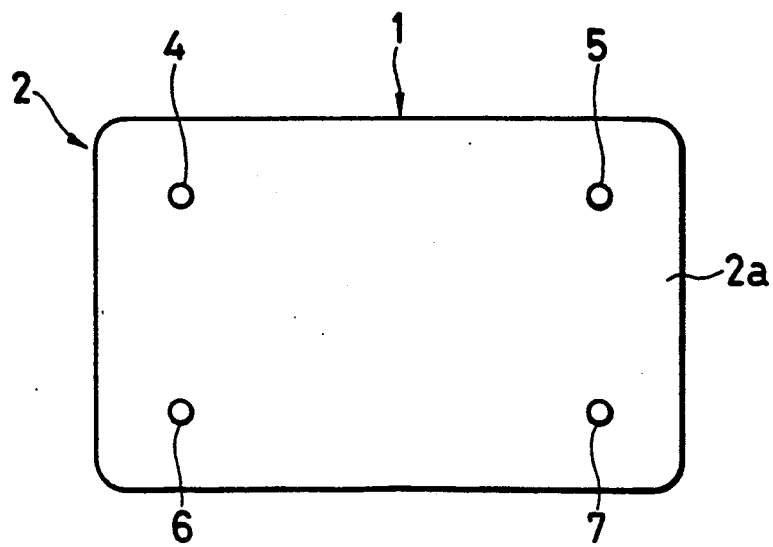
FIG. 3 is a bottom view of the sensor shown in FIG. 1.

FIGS. 1 to 4 show a structure of a pyroelectric infrared sensor 1 according to the present invention.

Referring to FIGS. 1 to 4, the sensor 1 comprises a package 2 comprised of a bottom plate 2a and a cap-like lid 2b mounted on the bottom plate 2a. A circuit board 3 mounted on the bottom plate 2a through terminal pins 4 to 7 is arranged in the package 2. The upper ends of the terminal pins 4 to 7 are connected to the circuit board 3, and the terminal pins 4 to 7 extend outside the package 2 through the bottom plate 2a.

An element mounting plate 11 is fixed on the upper surface of the circuit board 3. A multiple pyroelectric element 10 is mounted on the element mounting plate 11. FETs (Field Effect Transistors) 12a and 12b and the like are soldered on the lower surface (circuit pattern surface) of the circuit board 3. The multiple pyroelectric element 10 comprises a pyroelectric film 13, light-transmissive or light-absorptive electrodes (to be referred to as light-receiving electrodes hereinafter) 14a, 14b, 15a and 15b formed on the upper surface of the film 13, and back electrodes 16a, 16b, 17a and 17b (FIG. 2) formed on the lower surface of the film 13. The film 13 has a length of 15 mm, a width of 8 mm, and a thickness of 5 to 100 μm and consists of a polymeric ferroelectric substance such as PVDF (polyvinylidene fluoride) and a copolymer of VDF (vinylidene fluoride) with another monomer. The light-receiving electrodes 14a, 14b, 15a and 15b consist of a metal such as Ni, Cr or NiCr and have a thickness of, e.g., 0.001 to 0.02 μm each. The back electrodes 16a, 16b, 17a and 17b consist of a metal such as Al, Au., Ag or PtNi and have a thickness, e.g., 0.005 to 1.0 μm. The light-receiving electrodes 14a, 14b, 15a and 15b vertically overlap the back electrodes 16a, 16b, 17a and 17b. These overlapping portions constitute effective light-receiving electrode areas A, B, C and D. In this case, if the light receiving electrodes 14a, 14b, 15a and 15b are substantially in the same shapes as the electrodes 16a, 16b, 17a and 17b, respectively and if there are substantially no position shifts between the former and the latter, respectively, the effective light-receiving electrode areas A, B, C and D, as shown in FIG. 1, become substantially same as the sizes of the light-receiving electrodes 14a, 14b, 15a and 15b, respectively.

The light-receiving electrode 14a, the back electrode 16a opposite thereto, and a portion of the pyroelectric film 13 which is sandwiched between the electrodes 14a and 16a constitute a first unit pyroelectric element 20a. The light-receiving electrode 14b, the back electrode 16b opposite thereto, and a portion of the pyroelectric film 13 which is sandwiched between the electrodes 14b and 16b constitute a second unit pyroelectric element 20b. The light-receiving electrode 15a, the back electrode 17a opposite thereto, and a portion of the pyroelectric film 13 which is sandwiched between the electrodes 15a and 17a constitute a third unit pyroelectric element 21a. The light-receiving electrode 15b, the back electrode 17b opposite thereto, and a portion of the pyroelectric film 13 which is sandwiched between the electrodes 15b and 17b constitute a fourth unit pyroelectric element 21b. The first and second unit pyroelectric elements 20a and 20b are connected in series (FIG. 5) or parallel (FIG. 6) with each other so as to have opposite polarities indicated by arrows in FIGS. 5 and 6, thereby constituting a first dual pyroelectric element 22. Similarly, the third and fourth unit pyroelectric elements 21a and 21b are connected in series or parallel with each other to constitute a second pyroelectric element 23. The above connections can be achieved by connecting the electrodes or by connecting the electrodes to a conductive pattern formed on the circuit board 3, by leads 18 integral or unintegral with the electrodes 14a, 14b, 15a, 15b, 16a, 16b, 17a and 17b or any other proper electric connecting means. The first and second dual pyroelectric elements 22 and 23 constitute the multiple pyroelectric element 10.

Figure 4:
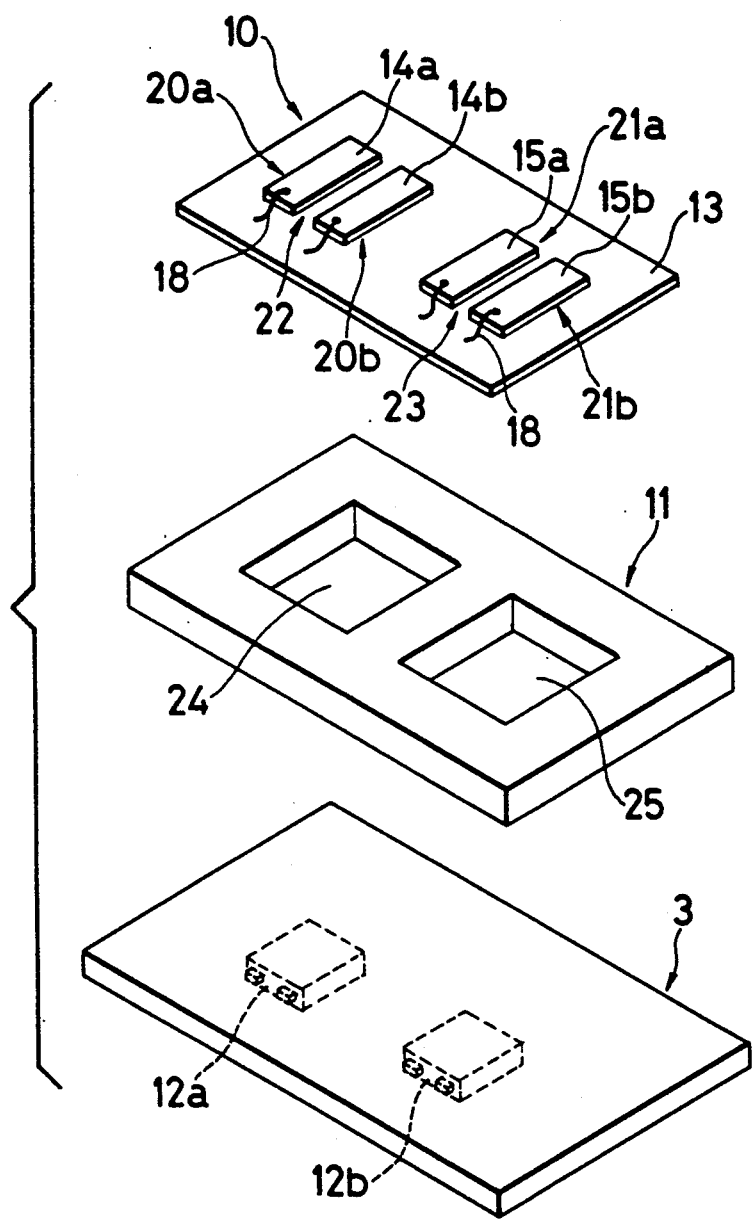
FIG. 4 is an exploded perspective view showing the main part of the sensor shown in FIG. 1.

As shown in FIG. 4, a pair of through holes 24 and 25 are formed in the element mounting plate 11. The back electrodes 16a and 16b of the first and second unit pyroelectric elements 20a and 20b correspond to the through hole 24, and the back electrodes 17a and 17b of the third and fourth unit pyroelectric elements 21a and 21b correspond to the through hole 25. In this manner, the multiple pyroelectric element 10 is mounted on the element mounting plate 11.

An opening 26 which serves as a substantially rectangular light-receiving window is formed opposing the central portion of the upper surface of the lid 2b of the package 2. An infrared transmissive optical filter 27 consisting of silicon or the like is in contact with the inner surface of the lid 2b and is adhered inside the lid 2b by an appropriate adhesive 28.

Figure 5:
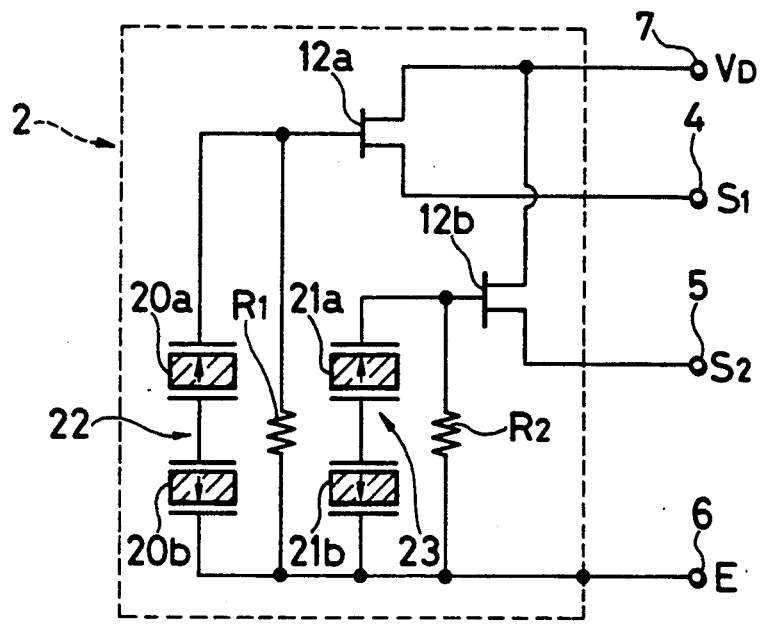
FIG. 5 is a wiring diagram showing a circuit arrangement of the sensor shown in FIG. 1.
Figure 6:
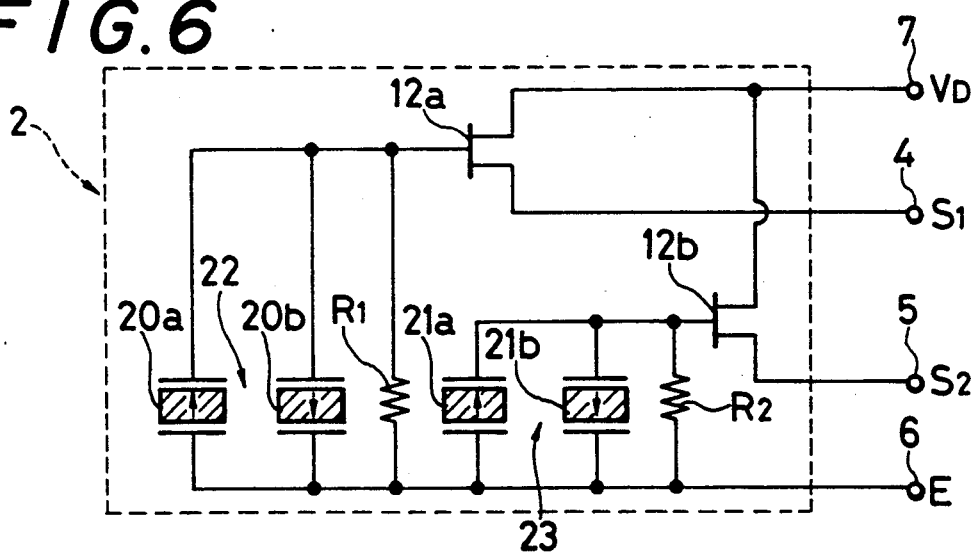
FIG. 6 is a wiring diagram showing another circuit arrangement of the sensor shown in FIG. 1.

FIGS. 5 and 6 show circuit arrangements of the pyroelectric infrared sensor 1 according to the present invention.

Referring to FIGS. 5 and 6, the FETs 12a and 12b are connected in parallel with a power source $V_D$. The dual pyroelectric elements 22 and 23 and gate resistors $R_1$ and $R_2$ are connected in parallel with the gate electrodes of the FETs 12a and 12b. Moving object detection signals are extracted from the source electrodes of the FETs 12a and 12b through the terminal pins 4 and 5, respectively. The terminal pin 6 is grounded.

In the circuit arrangement shown in FIG. 5, the pair of unit pyroelectric elements 20a and 20b constituting the first dual pyroelectric element 22 and the pair of unit pyroelectric elements 21a and 21b constituting the second dual pyroelectric element 23 are connected in series with each other so as to have opposite spontaneous polarities as indicated by the arrows. In the circuit arrangement shown in FIG. 6, the pair of unit pyroelectric elements 20a and 20b constituting the first dual pyroelectric element 22 and the pair of unit pyroelectric elements 21a and 21b constituting the second dual pyroelectric element 23 are connected in parallel with each other so as to have opposite spontaneous polarities as indicated by the arrows.

The pyroelectric infrared sensor shown in FIGS. 1 to 6 was conventionally manufactured such that the effective light-receiving electrode areas A, B, C and D of the pairs of unit pyroelectric elements 20a and 20b and 21a and 21b constituting the first and second dual pyroelectric elements 22 and 23 are substantially equal to each other. That is, since each of the light-receiving electrodes 14a, 14b, 15a and 15b and the back electrodes 16a, 16b, 17a and 17b of the unit pyroelectric elements 20a, 20b, 21a and 21b had a length of 3 mm and a width of 1 mm, each of the effective light-receiving electrode areas A, B, C and D constituted by the overlapping portions of the electrodes was, e.g., 3 mm$^2$, which was substantially equal to each area of the corresponding electrodes. However, the conventional sensor has poor electrical characteristics against disturbing external light, and a detection error occurs upon incidence of the disturbing external light.

Figure 7:
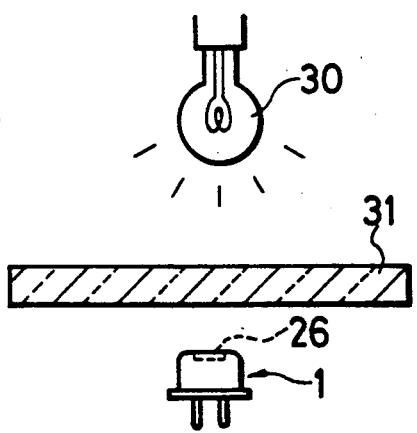
FIG. 7 is a schematic view showing a test for detecting a detection error of a conventional pyroelectric infrared sensor upon incidence of disturbing external light.

The present inventors conducted a test for detecting an error caused by disturbing external light in the conventional pyroelectric infrared sensor in order to examine a cause of the error, as shown in FIG. 7.

Light from a lamp 30 such as a halogen lamp or an incandescent lamp was radiated on the pyroelectric infrared sensor 1 through a glass plate 31. Furthermore, infrared rays from the lamp 30 were absorbed by the glass plate 31, and only visible light was incident on the sensor 1. Furthermore, the visible light was reflected by the optical filter 27 (FIG. 2) mounted on the light-receiving window 26. The present inventors found that the glass plate 31 and the optical filter 27 absorbed visible light and the infrared rays from the lamp 30 output secondary infrared rays, thereby erroneously operating the sensor 1. More specifically, the present inventors found that the pair of unit pyroelectric elements connected to have opposite polarities and constituting each dual pyroelectric element had to be arranged to have identical response characteristics for the primary radiation from the lamp 30 as well as the dispersed secondary infrared rays incident from the portion around the sensor 1.

The present inventors also found that the unit pyroelectric elements 20b and 21a located opposing the central portion of the light-receiving window 26 had an angle of visibility larger than that of the unit pyroelectric elements 20a and 21b located opposing the peripheral portion of the light-receiving window 26 so that a larger amount of secondary infrared rays were incident on the unit pyroelectric elements 20b and 21a than that on the unit pyroelectric elements 20a and 21b. The present inventors therefore found that the dual pyroelectric elements 22 and 23 were erroneously operated when the effective light-receiving electrode areas A, B, C and D of the respective unit pyroelectric elements 20a, 20b, 21a and 21b were substantially equal to each other.

The pyroelectric infrared sensor according to the present invention is manufactured such that each of the effective light-receiving electrode areas B and C of the unit pyroelectric elements 20b and 21a located opposing the central portion of the light-receiving window 26 is slightly smaller than each of the effective light-receiving electrode areas A and D of the unit pyroelectric elements 20a and 21b located opposing the peripheral portion of the light-receiving window 26. At the time of manufacture of the multiple pyroelectric element 10, in order to compensate for a difference between the amounts of secondary infrared rays incident on the respective unit pyroelectric elements 20a, 20b, 21a and 21b, the effective light-receiving electrode areas A, B, C and D are designed to be decreased as the angles of visibility of these unit pyroelectric elements with respect to the light-receiving window 26 are larger. According to this design concept, the light-receiving electrodes 14a, 14b, 15a and 15b and the back electrodes 16a, 16b, 17a and 17b of the unit pyroelectric elements are formed. With this arrangement, the difference between the amounts of secondary infrared rays incident on the unit pyroelectric elements 20a, 20b, 21a and 21b is compensated, and good electrical characteristics of the dual pyroelectric element against the disturbing external light can be improved.

A ratio of decrease in each of the effective light-receiving areas B and C of the unit pyroelectric elements 20b and 21a located opposing the central portion with respect to each of the effective light-receiving areas A and D of the unit pyroelectric elements 20a and 21b located opposing the peripheral portion varies in accordance with the shape of the light-receiving window 26 of the sensor 3 and the arrangement conditions of the unit pyroelectric elements 20a, 20b, 21a and 21b, etc. However, in general, the ratio of decrease is preferably 1% or more and more preferably 2% or more. When each light-receiving area B or C is excessively decreased, a detection error may occur by a change in room temperature. Therefore, the ratio of decrease is preferably 15% or less and more preferably 8% or less. The lower and upper limit values also apply to a linear arrangement shown in FIG. 1 in which the four unit pyroelectric elements 14a, 14b, 15a and 15b are arranged along the longitudinal direction of the rectangular light-receiving window 26.

In the pyroelectric infrared sensor 1 shown in FIGS. 1 to 4, the effective light-receiving electrode areas A, B, C, and D of the respective unit pyroelectric elements 20a, 20b, 21a and 21b are preferably given as follows:

$A (=D) = 3.1$ mm $\times 1.0$ mm $= 3.1$ mm$^2$
$B (=C) = 3.0$ mm $\times 1.0$ mm $= 3.0$ mm$^2$ The light-receiving electrodes 14a, 14b, 15a and 15b and the back electrodes 16a, 16b, 17a and 17b of the unit pyroelectric elements are formed according to the above design concept. Each of the areas B and C is smaller than each of the areas A and D by about 3.3%. In the sensor 1 having the above arrangement, since the difference between the angles of visibility of the unit pyroelectric elements with respect to the light-receiving window 26 can be compensated, errors caused by secondary infrared rays and changes in room temperature do not occur.

The above embodiment uses a multiple pyroelectric element consisting of two dual pyroelectric elements. However, the present invention is also applicable to a multiple pyroelectric element using three or more dual pyroelectric elements. For example, when a multiple pyroelectric element having third and fourth dual pyroelectric elements formed between the first and second dual pyroelectric elements 22 and 23 and having the same arrangements as those of the first and second dual pyroelectric elements is used, the effective light-receiving electrode areas of pairs of unit pyroelectric elements constituting the third and fourth dual pyroelectric elements are changed as needed. More specifically, the effective light-receiving electrode area of one of the pair of unit pyroelectric elements is slightly changed with respect to the other of the pair of unit pyroelectric elements (e.g., 1% to 15%). The first and second dual pyroelectric elements 22 and 23 use the common pyroelectric film 13. However, separate pyroelectric films may be used for dual pyroelectric elements.

The present invention has been described with reference to the illustrated embodiments in conjunction with the accompanying drawings. However, the present invention is not limited to the particular embodiments described above. It should be understood that various changes and modifications may be made by those skilled in the art without departing from the spirit and scope of the invention defined in the appended claims. For example, the size, shape, and material of the pyroelectric film 13 may be selected from any conventional size, shape, and material, or any other size, shape, and material. The material and thickness of the electrodes 14a, 14b, 15a, 15b, 16a, 16b, 17a and 17b may be selected from any conventional material and thickness or any other material and thickness. Various changes in arrangement of the electrodes 14a, 14b, 15a, and 15b and also in the arrangement of the electrodes 16a, 16b, 17a and 17b except for ones illustrated in FIG. 1 may be made. The shape and size, etc. of the light-receiving window 26 may be arbitrarily changed as needed. For example, an oval light-receiving window may be employed.

What is claimed is:

1. A pyroelectric infrared sensor comprising:
 a package having a light-receiving window; and
 at least two dual pyroelectric elements having each single pyroelectric element arranged adjacently in a row in said package,
 each of said at least dual pyroelectric elements being provided with
  a pyroelectric film,
  first and second light-receiving electrodes formed on a first surface of said pyroelectric film to oppose said light-receiving window, and
  first and second back electrode formed on a second surface of said pyroelectric film as a surface opposite to the first surface thereof,
  said first light-receiving electrode, said first back electrode, and a portion of said common pyroelectric film which is sandwiched between said first light-receiving electrode and said first back electrode constituting a first single pyroelectric element,
  said second light-receiving electrode, said second back electrode, and a portion of said common pyroelectric film which is sandwiched between said second light-receiving electrode and said second back electrode constituting a second single pyroelectric element, and
  said first and second single pyroelectric elements being connected in parallel with each other to have opposite polarities,
 wherein said first and second light-receiving electrodes and said first and second back electrodes are formed such that an effective light-receiving electrode area of said first single pyroelectric element opposing a central portion of said light-receiving window is smaller than an effective light-receiving electrode area of said second single pyroelectric element opposing a peripheral portion of said light-receiving window, therein compensating for a difference between amounts of secondary infrared rays incident on said first and second pyroelectric elements which is caused by a difference between angles on visibility of said first and second single pyroelectric elements with respect to the light-receiving window.

2. A sensor according to claim 1, wherein said at least two dual pyroelectric elements use a common pyroelectric film.

3. A sensor according to claim 1, wherein said light-receiving window is substantially rectangular.

4. A sensor according to claim 1, wherein said light-receiving electrodes of said at least two dual pyroelectric elements are substantially aligned along said light-receiving window such that said back electrodes of said dual pyroelectric elements respectively oppose said light-receiving electrodes through said pyroelectric film.

5. A sensor according to claims 1, 2, 3 or 4, wherein the effective light-receiving electrode area of said first single pyroelectric element is smaller than the effective light-receiving electrode area of said second single pyroelectric element within a range of 1 to 15%.

6. A sensor according to claim 1, 2, 3 or 4, wherein the effective light-receiving electrode area of said first single pyroelectric element is smaller than the effective light-receiving electrode area of said second single pyroelectric element within a range of 2 to 8%.

7. A method of manufacturing a dual pyroelectric element used in a pyroelectric infrared sensor, said method comprising the steps of:
forming a first light-receiving electrode and a first back electrode as a first single pyroelectric element opposing a central portion of a light-receiving window;
forming a second light-receiving electrode and a second back electrode as a second single pyroelectric element opposing a peripheral portion of said light-receiving window;
forming an effective light-receiving electrode area of said first single pyroelectric element, opposing the central portion of said light-receiving window, smaller than an effective light-receiving electrode area of said second single pyroelectric element opposing the peripheral portion of said light-receiving window in a range 1 to 15%;
connecting, as a first dual pyroelectric element, said first and second single pyroelectric elements in parallel with each other so as to have opposite polarities;
forming a third light-receiving electrode and a third back electrode as a third single pyroelectric element opposing said central portion of said light-receiving window;
forming a fourth light-receiving electrode and a fourth back electrode as a fourth single pyroelectric element opposing said peripheral portion of said light-receiving window;
forming an effective light-receiving electrode area of said third single pyroelectric element, opposing the central portion of said light-receiving window, smaller than an effective light-receiving electrode area of said fourth single pyroelectric element opposing the peripheral portion of said light-receiving window in a range 1 to 15%;
connecting, as a second dual pyroelectric element, said third and fourth single pyroelectric in parallel with each other so as to have opposite polarities; and
adjacently arranging said first and second dual pyroelectric elements into a row.

8. A method of manufacturing a dual pyroelectric element used in a pyroelectric infrared sensor comprising the steps of:
forming a first light receiving electrode and a first back electrode as a first single pyroelectric element opposing a central position of a light-receiving window;
forming a second light-receiving electrode and a second back electrode as a second single pyroelectric element opposing a peripheral portion of said light-receiving window;
forming an effective light-receiving electrode area of said first single pyroelectric element, opposing the central portion of said light-receiving window, smaller than an effective light-receiving electrode area of said single pyroelectric element opposing the peripheral portion of said light-receiving window in a range of 2 to 8%;
connecting, as a first dual pyroelectric element, said first and second single pyroelectric elements in series with each other so as to have opposite polarities;
forming a third light-receiving electrode and a third back electrode as a third single pyroelectric element opposing said central position of said light-receiving electrode;
forming a fourth light-receiving electrode and a fourth back electrode as a fourth single pyroelectric element opposing said peripheral portion of said light-receiving window;
forming an effective light-receiving electrode area of said third single pyroelectric element, opposing the central portion of said light-receiving window, smaller than an effective light-receiving electrode area of said fourth single pyroelectric element opposing the peripheral portion of said light-receiving window in a range of 2 to 8%;
connecting, as a second dual pyroelectric element, said third and fourth single pyroelectric elements in series with each other so as to have opposite polarities; and
adjacently arranging said first and second dual pyroelectric elements in a row.

9. A method according to claim 7 or 8, wherein said first and second light-receiving electrodes and said first and second back electrodes are formed on a common pyroelectric film.

10. A method according to claims 7 or 8, wherein said light-receiving electrodes are aligned along said light-receiving window and respectively oppose said light-receiving window and respectively oppose said back electrodes through a pyroelectric film.

11. A pyroelectric infrared sensor comprising:
a package having a light-receiving window;
at least two first pyroelectric elements each having a first effective light-receiving electrode area formed by a first light-receiving electrode opposed to said light-receiving window, a first back electrode and a pyroelectric film sandwiched therebetween; and
at least two second pyroelectric elements each having a second effective light-receiving electrode area formed by a second light-receiving electrode opposed to said light-receiving window, a second back electrode and a pyroelectric film sandwiched therebetween, said second light effective-receiving electrode area is larger than said first light effective-receiving electrode area,
each first pyroelectric element connected in series to a corresponding second pyroelectric element as a pair having opposite polarity and forming at least two dual pyroelectric elements, said dual pyroelectric elements linearly arranged in said package having each first and second pyroelectric elements arranged in a row,
said first effective light-receiving electrode area opposing a central portion of said light-receiving window and said second effective light-receiving electrode area opposing a peripheral portion of said light-receiving window in each dual pyroelectric element,
therein compensating for a difference between amounts of secondary infrared rays incident on said first and second pyroelectric elements which is caused by a difference between angles of visibility of said first and second pyroelectric

* * * * *